US010103088B1

(12) United States Patent
Qi et al.

(10) Patent No.: US 10,103,088 B1
(45) Date of Patent: Oct. 16, 2018

(54) INTEGRATED ANTENNA FOR DIRECT CHIP ATTACH CONNECTIVITY MODULE PACKAGE STRUCTURES

(71) Applicant: Intel IP Corporation, Santa Clara, CA (US)

(72) Inventors: Quan Qi, Beaverton, OR (US); Brian R. Butcher, Queen Creek, AZ (US); Carlton E. Hanna, Santa Clara, CA (US); Hong Wei Hu, Gilbert, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/473,251

(22) Filed: Mar. 29, 2017

(51) Int. Cl.
*H01L 23/498* (2006.01)
*H01L 23/433* (2006.01)
*H01L 23/00* (2006.01)
*H01L 23/538* (2006.01)
*H01L 25/065* (2006.01)

(52) U.S. Cl.
CPC .... *H01L 23/4334* (2013.01); *H01L 23/49816* (2013.01); *H01L 23/5389* (2013.01); *H01L 24/19* (2013.01); *H01L 24/20* (2013.01); *H01L 25/0652* (2013.01); *H01L 2924/18165* (2013.01)

(58) Field of Classification Search
CPC ........... H01L 23/5389; H01L 23/49822; H01L 23/552; H01L 25/0652; H01L 25/0665; H01L 2223/6677
See application file for complete search history.

(56) References Cited

U.S. PATENT DOCUMENTS

2008/0158063 A1\* 7/2008 Zeng ..................... H01Q 1/2283
343/700 MS

\* cited by examiner

*Primary Examiner* — Hoai V Pham
(74) *Attorney, Agent, or Firm* — Green, Howard & Mughal LLP

(57) ABSTRACT

Methods of forming microelectronic package structures, and structures formed thereby, are described. Those methods/structures may include a die disposed on a first substrate, at least one component adjacent the die on the first substrate, a molding material on the die and the at least one component, wherein the die and the at least one component are completely embedded in the molding material, a second substrate, wherein the first substrate is disposed on a top surface of the second substrate, and at least one communication structure disposed on a surface of the second substrate.

23 Claims, 12 Drawing Sheets

INTEGRATED ANTENNA FOR DIRECT CHIP ATTACH CONNECTIVITY MODULE PACKAGE STRUCTURES

BACKGROUND

Connectivity solutions for microelectronic package structures may utilize printed circuit board (PCB) technologies, as well as substrate based silicon in package (SiP) solutions/technologies. PCB based module solutions can provide a significant cost advantage, particularly for mainstream high volume manufacturing (HVM) connectivity products.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

FIGS. 1l-1m represent cross-sectional views of structures according to embodiments.

DETAILED DESCRIPTION

Figure 1A:
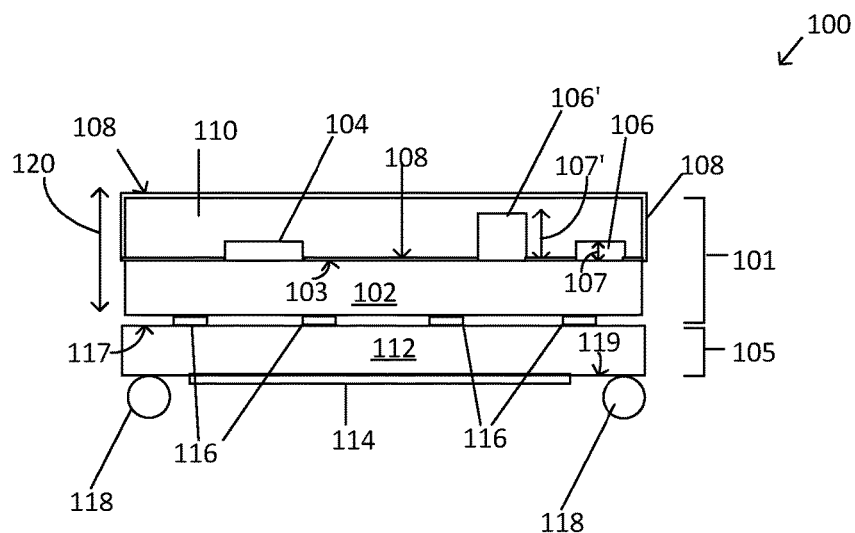
FIGS. 1a-1d represent cross-sectional views of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between an electrical component, such a an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die may include a front-side and an opposing back-side. In some embodiments, the front-side may be referred to as the "active surface" of the die. A number of interconnects may extend from the die's front-side to the underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some one embodiment, a die may be disposed on a substrate in a flip-chip arrangement. In an embodiment interconnects comprises an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be disposed on the terminals of the substrate and/or die, and these terminals may then be joined using a solder reflow process. Of course, it should be understood that many other types of interconnects and materials are possible (e.g., wirebonds extending between a die and substrate). In some embodiments herein, a die may be coupled with a substrate by a number of interconnects in a flip-chip arrangement.

However, in other embodiments, alternative structures and/or methods may be utilized to couple a die with a substrate.

Embodiments of methods of forming packaging structures, including methods of forming connectivity modules, such as partially molded direct chip attach die (DCA) connectivity solutions/structures comprising integrated antenna solutions, are described. Those methods/structures may include a die disposed on a first substrate, at least one component adjacent the die on the first substrate, and a molding material on the die and the at least one component, wherein the die and the at least one component are completely embedded in the molding material. A second substrate may be disposed on a bottom surface of the first substrate, and at least one communication structure may be disposed on at least one surface of the second substrate. The embodiments herein enable flexibility in the design of low cost, electromagnetic interference (EMI) shielded connectivity modules solutions comprising integrated antenna structures, for example.

The Figures herein illustrate embodiments of fabricating package structures comprising optimized components and stiffener architectures. In FIG. 1a (cross-sectional view), a portion of a package structure 100, such as a direct chip attach (DCA) connectivity package structure/module 100, is shown. In an embodiment, a first substrate 102, may comprise a board, such as a printed circuit board (PCB board), for example, and in other embodiments, the first substrate 102 may comprise a high density PCB, wherein routing/interconnect lines within the first substrate may comprise about 40/40 micron trace/spacing and/or line/space (L/S) design rules. In another embodiment, the first substrate 102 may comprise about 25/25 micron L/S dimensions.

In another embodiment, the first substrate 102 may comprise an embedded trace PCB (ETP) (FIG. 1l). The ETP substrate 102 may comprise embedded traces 109 (as well as various conductive contact and via structures 122, for example) disposed in a dielectric material 111, wherein a die/device 104 may be physically and electrically coupled to the embedded traces 109, and at least one component 106 may be disposed and electrically coupled to the embedded traces 109 on the first substrate 102. The embedded traces 109 may comprise trace/spacing (L/S) of about 12/12 microns to about 7/7 microns, in some embodiments. Thus, the employment of an ETP substrate as a first substrate 102 in the package substrates described herein serves to improve routing capacity of the module, and ensures efficient routing with reduced layer counts which reduces the Z-height 120 of the module 100, as well as accommodating surface mount technology (SMT) assembly/components 106, molding underfill and electromagnetic interference (EMI) shielding.

In an embodiment (referring back to FIG. 1a), a die/device 104, such as a microelectronic die, may be disposed on a top surface 103 of the first substrate 102. In an embodiment, the die 104 may comprise any type of microelectronic device, including devices comprising wireless capabilities, such as but not limited to a microprocessor, a graphics processor, a signal processor, a network processor, a chipset, etc. In one embodiment, the die 104 comprises a system on a chip (SOC) having multiple functional units (e.g., one or more processing units, one or more graphics units, one or more communications units, one or more signal processing units, one or more security units, etc.). However, it should be understood that the disclosed embodiments are not limited to any particular type or class of die/devices. The device/die 104 may be electrically and physically coupled with the first substrate/board 102 by solder balls/conductive structures (not shown). In an embodiment, more than one die 104 may be disposed on the top surface 103 of the first substrate 102. In an embodiment, the die 104 may comprise a bare die.

At least one component 106 (shown as two components 106, 106' for illustration purposes) may be disposed adjacent the die 104 on the top surface of the first substrate 102. The at least one component 106 may comprise such components as a die-side capacitor, an inductor, and/or a component comprising a crystal oscillator for example. In an embodiment, the at least one component 106 may comprise any other suitable type of circuit elements/devices, such as a resistor, for example, according to the particular design requirements. In an embodiment, individual ones of the at least one component 106 may comprise different heights from each other. For example, the component 106 may comprise a height 107 that may be less than a height 107' of the component 106', in an embodiment. In an embodiment, the height 107' may be at least about 10 percent higher than the height 107 of the component 106. In other embodiments, the height 107' of the component 106' may be about twice as high or higher than the height 107 of the component 106. The various heights of the at least one component 106, 106' may vary depending upon the design requirements of the particular application.

A molding material 110 may be disposed on the die 104 and on the at least one component 106. The molding material 110 may be disposed on the top surface 103 of the first substrate 102. The molding material 110 may comprise an epoxy material in an embodiment, or may comprise any other suitable material as required by the particular application. In an embodiment, the molding material 110 may comprise a molding underfill material (MUF), wherein the die 104 and the at least one component 106 may be fully embedded within the molding material 110. A shielding material 108, such as an electromagnetic interference (EMI) shield material, may be disposed on a top surface and on side surfaces of the molding material 110, and on at least a portion of the top surface 103 of the first substrate 102. The shielding material 108 may comprise a conductive material, such as copper, for example, or may comprise such materials as composite materials, including a thin metal layer. In an embodiment, the shielding material 108 may comprise a sputtered conductive material, and may comprise a thickness of about 3 microns to about 7 microns. In an embodiment, the shielding material 108 may be disposed between the top surface 103 of the first substrate 102 and the molding material 110.

The shielding material 108 may serve to protect/shield the module 100 from un-desired EMI/radio frequency (RF) radiation/signals. In an embodiment, the first substrate 102 comprising the molding material 110, embedded die 104 and embedded components 106, and shielding material 108 may comprise a first portion 101 of the (DCA) connectivity module 100. In an embodiment, the first portion of the DCA connectivity module 100 may comprise a Z height 120. In an embodiment, the first substrate 102 of the first portion 101 of the module 100 may be utilized to support the routing needs & assembly requirements of surface mount (SMT) components, molding operations, as well as EMI shielding operations/processes.

In an embodiment, the first substrate 102 may be disposed on a second substrate 112. The first substrate 102 may be attached to the second substrate 112 by conductive interconnect structures 116. In an embodiment, the conductive interconnect structures 116 may comprise solder joints, bumps, conductive epoxy or any other suitable conductive material. At least one surface, such as a top surface 117 and/or a bottom surface 119 of the second substrate 112, may comprise a communication structure 114, which may comprise a wireless communication structure 114, in an embodiment. In an embodiment, the second substrate 112 comprising the communication structure 114 may comprise a second portion 105 of the DCA connectivity module 100. The second substrate 112 may further comprise conductive interconnect structures 118 (to conductively couple to another board, such as a motherboard, for example) on the bottom surface 119. In an embodiment, the conductive interconnect structures 118 may comprise ball grid array (BGA) structures, but in other embodiments the conductive interconnect structures may comprise land grid array (LGA) structures.

In an embodiment, the communication structure 114 may comprise an antenna structure 114 for example, and may be disposed on the bottom surface 119. The communication structure 114 may serve to allow for wireless communication between the package structure 100 and external and/or internal components, in an embodiment. The second substrate 112 may comprise a low routing density PCB in an embodiment, wherein the routing density may be sufficient to accommodate the routing requirements of the communication structure 114 and any other components disposed on the second substrate, but may not comprise the routing density needed for the components and die(s) disposed on the first substrate 102. In an embodiment, the second substrate 112 may comprise a routing density of about 40/40 L/S or less design rules. In an embodiment, the L/S density of the second substrate 112 may be less (and may be about 50 percent less in some cases) than the L/S routing density of the first substrate 102.

In an embodiment, the second substrate 112 may comprise a low cost substrate, wherein the second substrate 112 may comprise a 1-2 layer PCB and may accommodate land grid array and/or ball grid array solder down attachment of the communication structure 114, but may not comprise sufficient routing density to accommodate surface mount technology (SMT) components, molding material such as molding underfill, EMI shielding, and silicon die, which may be supported by the routing density of the first substrate 102. In other embodiments, the second substrate may comprise higher routing capabilities, such as about 49/49 L/S or above, depending upon the particular application.

Figure 1B:
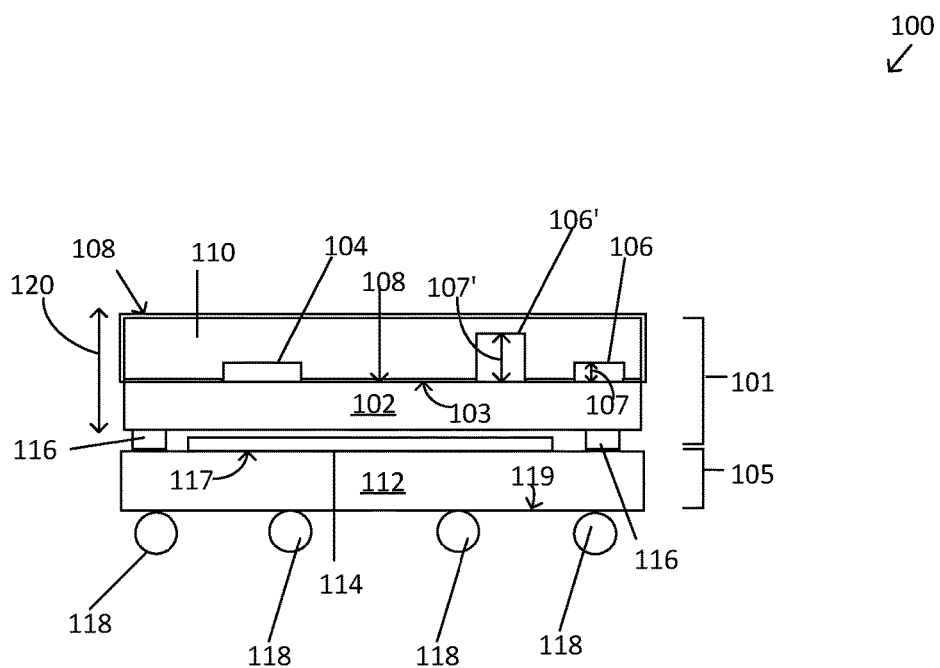
Figure 1C:
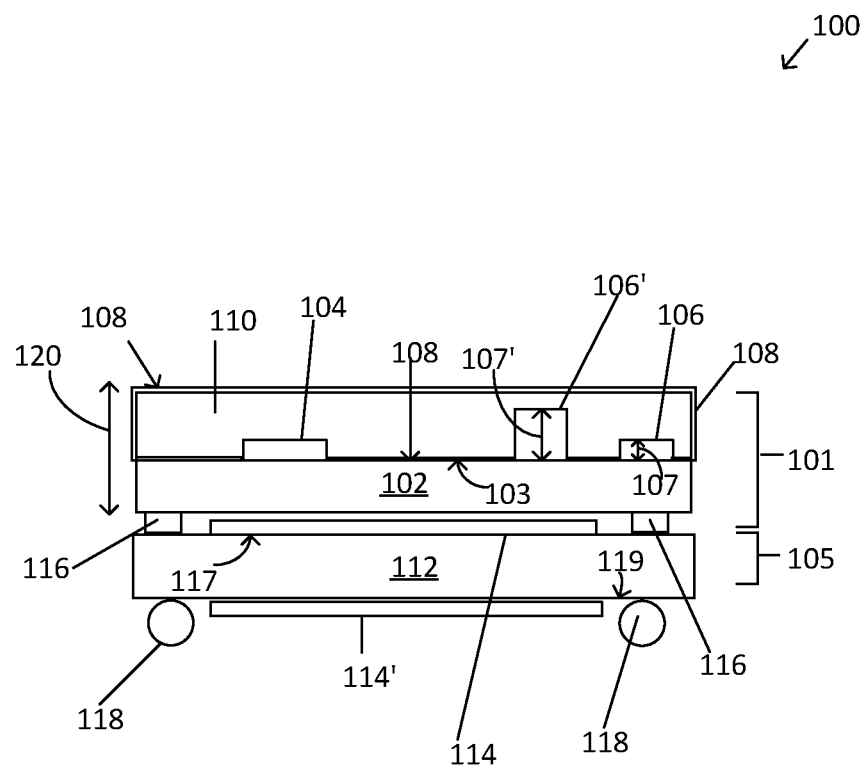

FIG. 1b depicts a cross sectional view of another embodiment, wherein a communication structure 114 may be disposed on a top surface 117 of the second substrate 114. In an embodiment, the communication structure 114 may be disposed between the first and second substrates 102, 112, wherein the communication structure 114 may not be directly disposed on the first substrate. There may be a gap disposed between the first substrate 102 and a top surface of the communication structure 114. In an embodiment, the communication structure 114 may be disposed between adjacent conductive interconnect structures 116. In an embodiment, the communication structures 114, 114' may comprise any physical layout/structure, and/or configuration as required by the particular application. In another embodiment, a first and a second communication structure/device 114, 114' may be disposed on both top 117 and bottom 119 surfaces of the second substrate 112 respectively (FIG. 1c). In an embodiment, the module/package structure 100 of FIG. 1c may be employed in 2×2 and/or multiple input multiple output (MIMO) applications. In an embodiment, the first and second communication structures 114, 114' may operate independently.

Figure 1D:
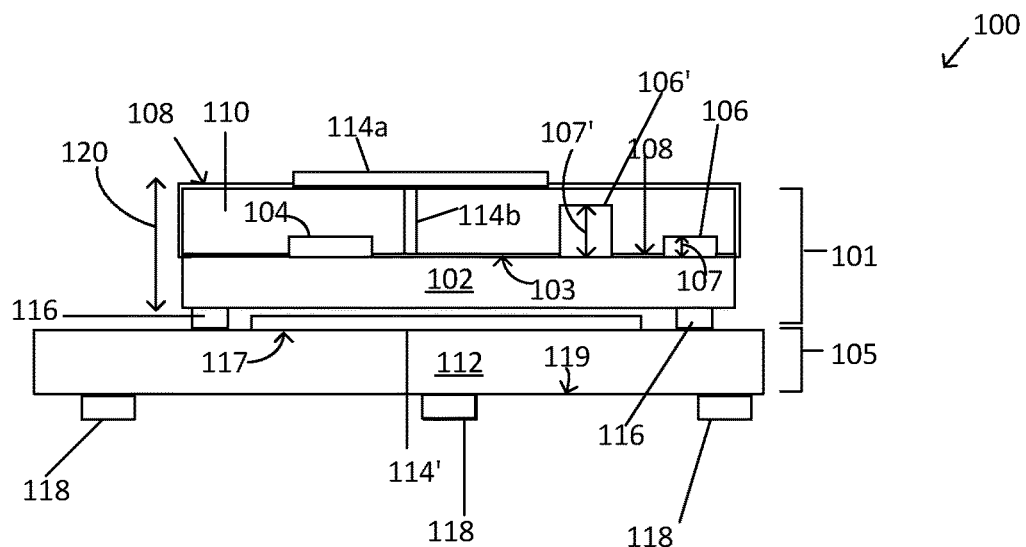

FIG. 1d depicts a cross sectional view of another embodiment, wherein a communication structure 114, such as an antenna, is disposed on a top surface and through at least a portion of the molding material 110. The communication structure 114 may comprise a first portion 114a and a second portion 114b and may comprise a first communication structure 114. The first portion 114a may be disposed on the top surface of the molding material 110, and the second portion 114b may be extend through and be disposed within the molding material 110. The second portion 114b may extend through the molding material 110 and may be disposed on a portion of the shielding material 108 that is disposed on the top surface 103 of the first substrate 102. A second antenna/communication structure 114' may be disposed on a top surface 117 of the second substrate 112 as well. In an embodiment, the module/package structure 100 of FIG. 1d may be employed in 2×2 and/or multiple input multiple output (MIMO) applications. In an embodiment, the first and second communication structures 114, 114' may operate independently.

Figure 1E:
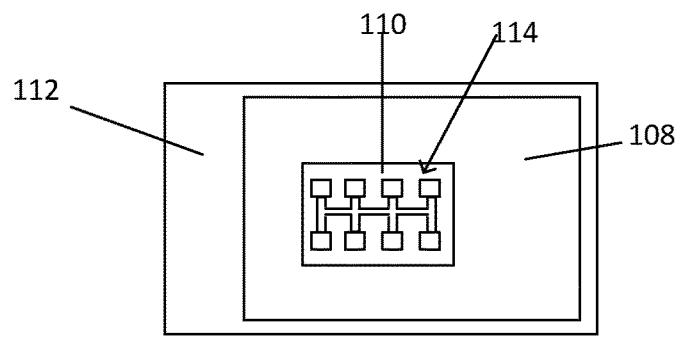
FIG. 1e represents a top view of structures according to embodiments.

FIG. 1e depicts a top view of the module 100 of FIG. 1d, wherein the first antenna 114 is disposed on a top surface of the molding material 110. The first antenna 114 may comprise any shape/configuration as required by the application, and is depicted in FIG. 1e as a first and a second row of discreet rectangles that are physically coupled to each other with conductive traces. The antenna 114 may comprise any suitable conductive material, such as copper for example. Shielding material 108 may be adjacent the antenna 114 on the top surface of the molding material 110, and the second substrate 112 may be disposed below the first substrate 102. A portion of the second substrate 112 may be adjacent the footprint of the first portion 101 of the module 100, in an embodiment.

Figure 1F:
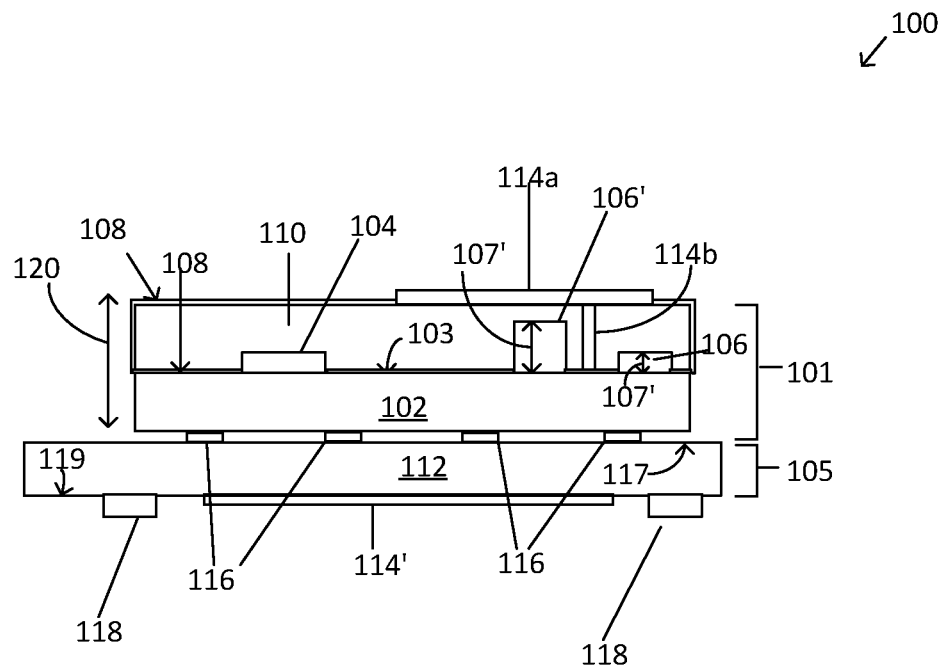
FIG. 1f represents a cross-sectional view of structures according to embodiments.
Figure 1G:
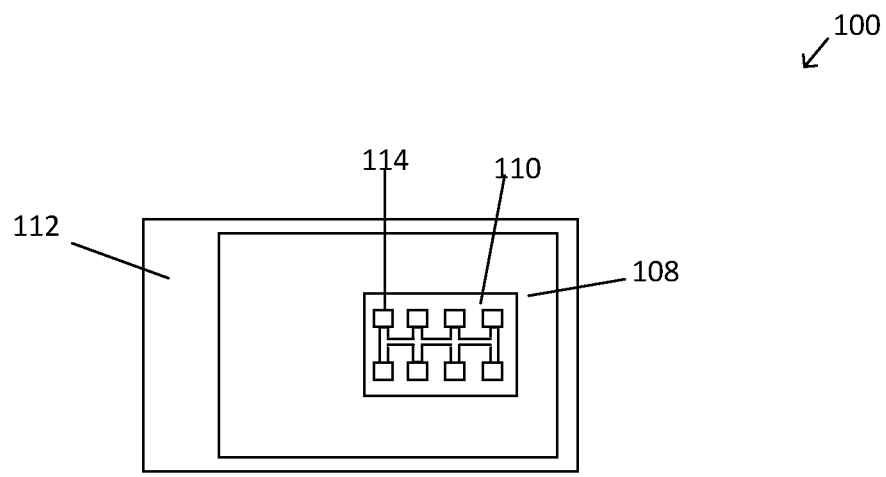
FIG. 1g represents a top view of structures according to embodiments.

In another embodiment, the module 100 may comprise a first communication structure 114 comprising a first and second portion 114a, 114b (similar to the first communication structure of FIG. 1d) wherein the first portion 114a is disposed on a top surface of the molding material 110 and wherein the second portion 114b may extend through the molding material 110 disposed on the first substrate 102 (FIG. 1f). A second communication structure 114', which may comprise a second antenna in an embodiment, may be disposed on a bottom surface 119 of the second substrate 112. FIG. 1g depicts a top view of FIG. 1f, wherein the first antenna 114 is disposed on the molding material 110, and wherein the shielding material 108 is adjacent the first antenna 114 on the mold material 110. The second substrate 112 is disposed below the first substrate 102 and a portion of the second substrate 112 is adjacent the footprint of the first portion 101 of the module 100.

Figure 1H:
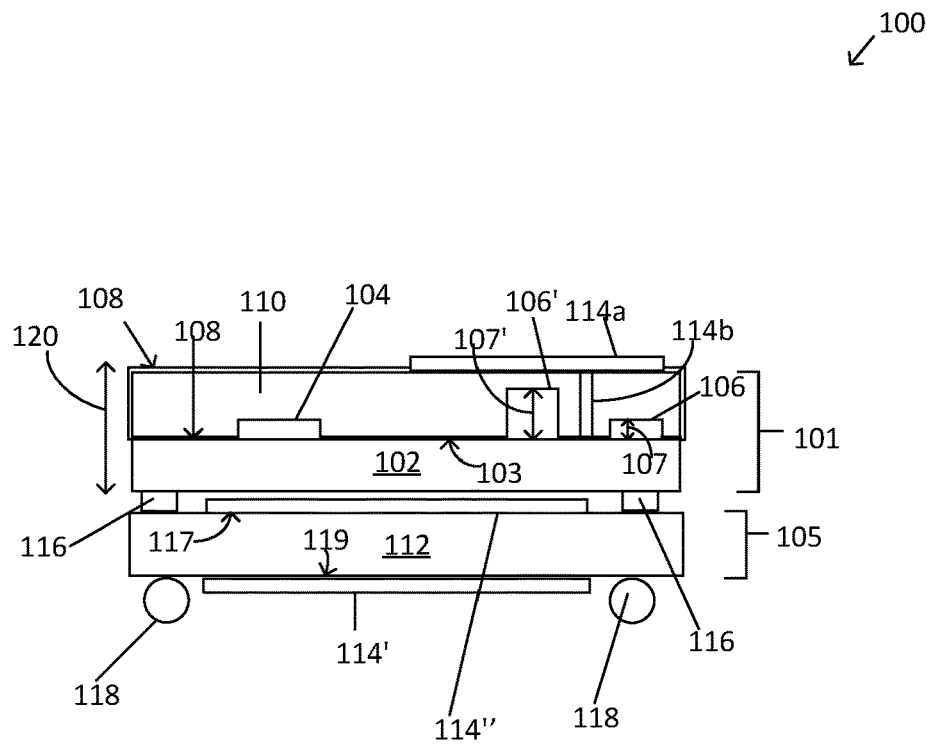
FIG. 1h represents a cross sectional view of structures according to embodiments.

In another embodiment, the module 100 may comprise a first communication structure 114 comprising a first and second portion 114a, 114b wherein the first portion 114a is disposed on a top surface of the molding material 110 and wherein the second portion 114b may extend through the molding material 110 disposed on the first substrate 102 (FIG. 1h). A second communication structure 114', which may comprise a second antenna in an embodiment, may be disposed on a bottom surface 119 of the second substrate 112, and a third communication structure 114", which may comprise a third antenna in an embodiment, may be disposed on a top surface 117 of the second substrate 112. In an embodiment, the module/package structure 100 of FIG. 1h may be employed in 3×3 and/or MIMO applications. In an embodiment, the first, second and third communication structures 114, 114' 114" may operate independently.

Figure 1I:
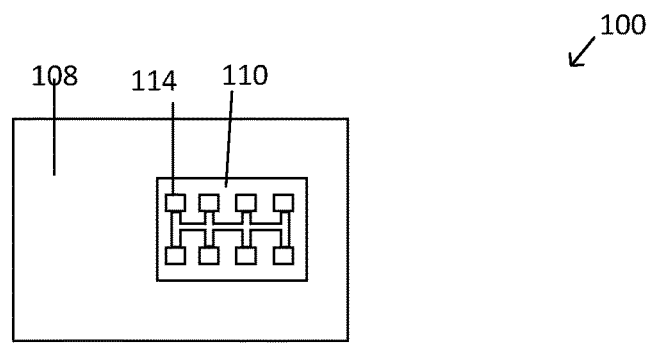
FIG. 1i represents a top view of structures according to embodiments.
Figure 1J:
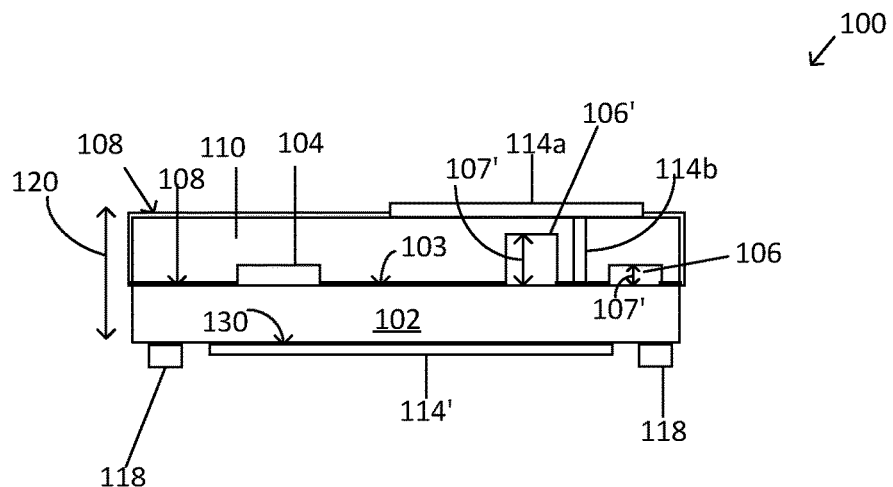
FIG. 1j represents a cross sectional view of structures according to embodiments.
Figure 1K:
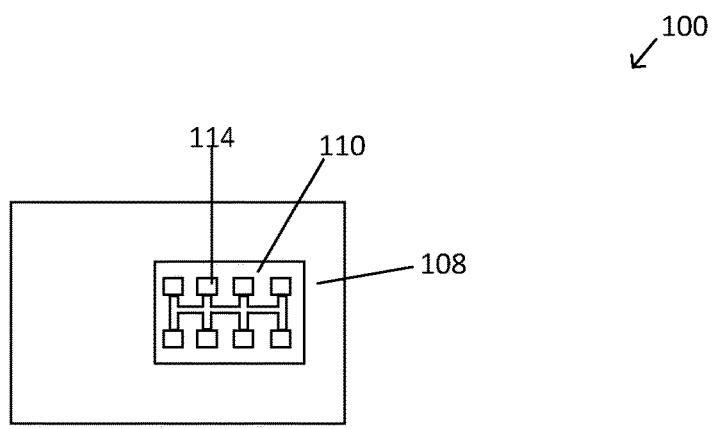
FIG. 1k represents a top view of structures according to embodiments.
Figure 1I:
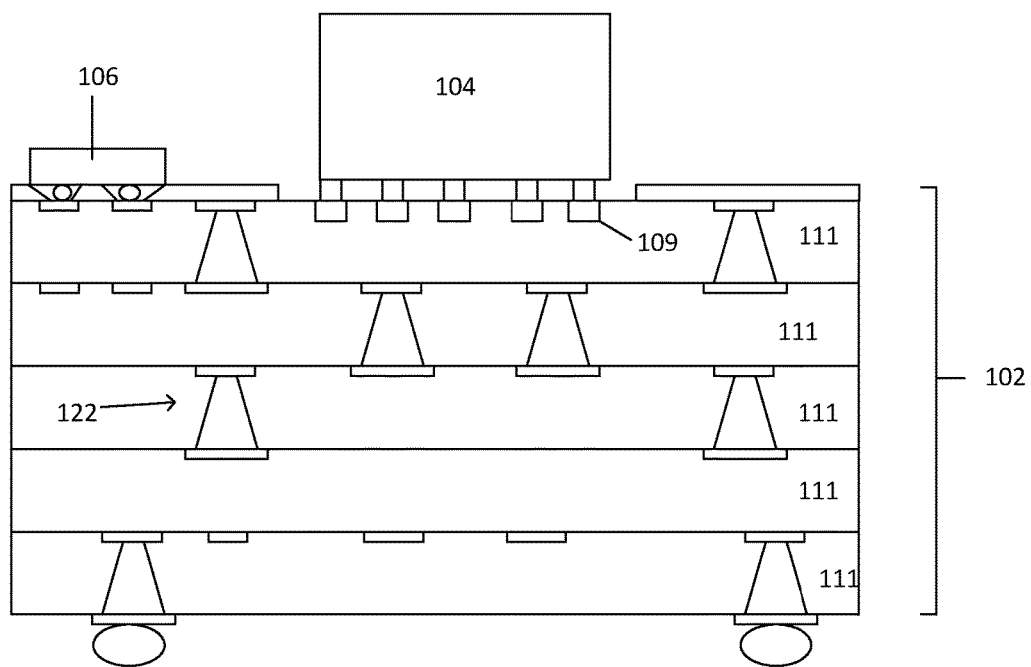

FIG. 1i depicts a top view of FIG. 1h, wherein the first antenna 114 is disposed on the molding material 110, and wherein the shielding material 108 is adjacent the first antenna 114 on the mold material 110. In another embodiment, the module 100 may comprise a first communication structure 114 comprising a first and second portion 114a, 114b wherein the first portion 114a is disposed on a top surface of the molding material 110 and wherein the second portion 114b may extend through the molding material 110 disposed on the first substrate 102 (FIG. 1j). The first substrate 102 further comprises a die/device 104 and at least one component 106 embedded within the molding material 110. A second communication structure 114', which may comprise a second antenna 114' in an embodiment, may be disposed on a bottom surface 130 of the first substrate 102, wherein the first substrate may further include conductive interconnect structure 118, such as BGA or LGA conductive structures. The embodiment of FIG. 1j may enable such applications as 2×2 and/or MIMO. In an embodiment, the first and second communication structures 114, 114' may operate independently. The embodiment herein does not comprise a second substrate. FIG. 1k depicts a top view of FIG. 1j, wherein the first antenna 114 is disposed on the molding compound 110, and the shielding material 108 is adjacent the first antenna 114.

Figure 1M:
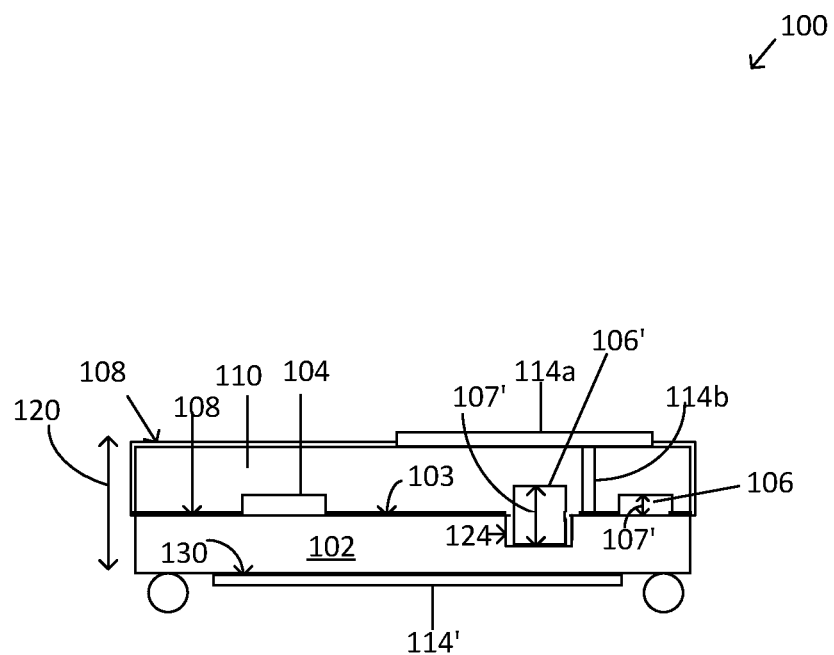

In another embodiment, the module 100 (similar to the module of FIG. 1j), may comprise a tall component 106' and a short component 106 disposed on the first substrate 102 (FIG. 1m). In an embodiment, the tall component 106' may be assembled inside a cavity 124 of the first substrate 102 (FIG. 1f). The cavity 124 may comprise a height that may vary depending upon the particular application, and may be adjusted for the height 107' of the tall component 106'. In addition, the tall component 106' may be at least partially within the cavity, and in other embodiments, may be disposed fully within the cavity 124. Assembling/placing the tall component 106' into the cavity 124 serves to reduce the overall z-height 120 of the module/package structure 100. The embodiment of FIG. 1m may enable such applications as 2×2 and/or MIMO. In an embodiment, first and second communication structures 114, 114' may operate independently.

Figure 1N:
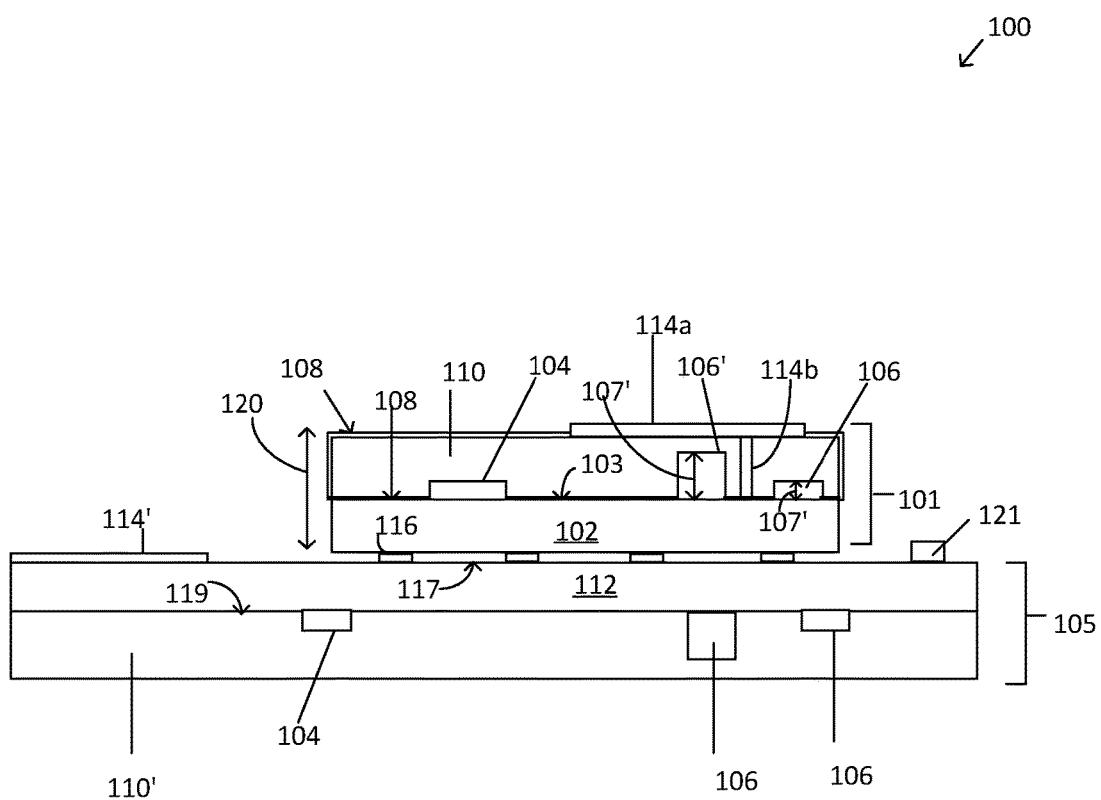
FIG. 1n represents a cross sectional view of structures according to embodiments.

In another embodiment, the module 100 may comprise a first communication structure 114 comprising a first and second portion 114a, 114b wherein the first portion 114a is disposed on a top surface of the molding material 110, and wherein the second portion 114b may extend through the molding material 110 that is disposed on the first substrate 102 (FIG. 1n). A second communication structure 114', which may comprise a second antenna in an embodiment, may be disposed on a top surface 117 of a second substrate 112 that is disposed on the first substrate 102, wherein the second communication structure 114' may be adjacent the footprint of the first substrate 102. A connector 121, which may support wireless communication between device structures within and/or external to the module 100, may be disposed on the top surface 117 of the second substrate 112, and may be adjacent the footprint of the first substrate 102, in an embodiment. At least one device 104 and at least one component 106 may be disposed/embedded within a molding material 110' that is disposed on a bottom surface 119 of the second substrate 112. In the embodiment of FIG. 1n, complex combinations of devices and antenna are enabled.

The various embodiments of the package assemblies/structures describe herein a new approach to building modules, such as wireless modules, by directly assembling silicon devices onto PCB carriers, for example. For DCA connectivity modules, molded solutions possess the advantage of providing superior physical protection to bare silicon devices than lidded shield solutions. The structures herein enable the reduction of form factor while integrating antenna and improving coupling efficiency. Embodiments include DCA connectivity modules comprising two portions: one portion with a PCB that may accommodate components, die etc., and another portion comprising a connector and/or an integrated antenna.

In some embodiments, ETP substrates may be employed in the first portion of the module to increase routing capacity from standard routing capabilities of high density interface (HDI) PCB technologies, for example. ETP substrates enable design feasibility while reduced the number of layers within a first substrate, and consequently reducing Z height. The second portion of the connectivity modules described herein comprise one-or-two layer, "low cost" PCB second substrate structures with connectors and/or antenna disposed thereon. Connections between the two substrates may be achieved with solder joint, or conductive epoxy or regular epoxy if efficient coupling can be achieved without wires. Embodiments include the "off-loading" of tall components to the second substrate, as well as placing components within a cavity of the second substrate, to reduce Z height/form factor.

Figure 2:
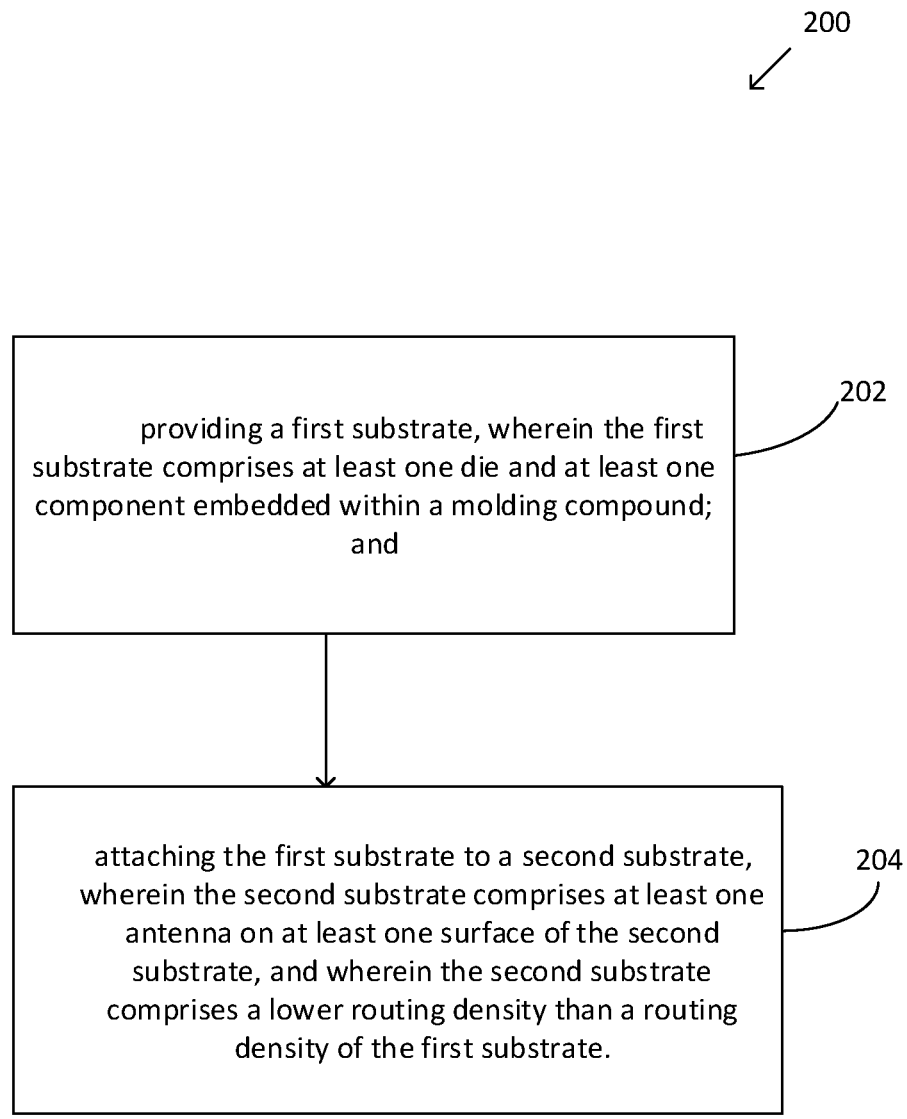
FIG. 2 represents a flow chart of a method according to embodiments.

FIG. 2 depicts a method 200 of forming a package structure according to embodiments herein. At step 202, a first substrate may be provided, wherein the first substrate comprises at least one die and at least one component embedded within a molding compound. In an embodiment, the first substrate may comprise a first portion of an antenna on a top surface of the molding material and a second portion of the antenna extending through the molding material. At step 204, the first substrate may be attached to a second substrate, wherein the second substrate comprises at least one antenna on at least one surface of the second substrate, and wherein the second substrate comprises a lower routing density than a routing density of the first substrate. The second substrate may comprise an antenna and/or connector disposed on a top surface, as well as additional components such as SMT components disposed thereon. The second substrate may not comprise molding material, in an embodiment. In other embodiments, the second substrate may comprise molding material on a bottom surface.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the package structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 3:
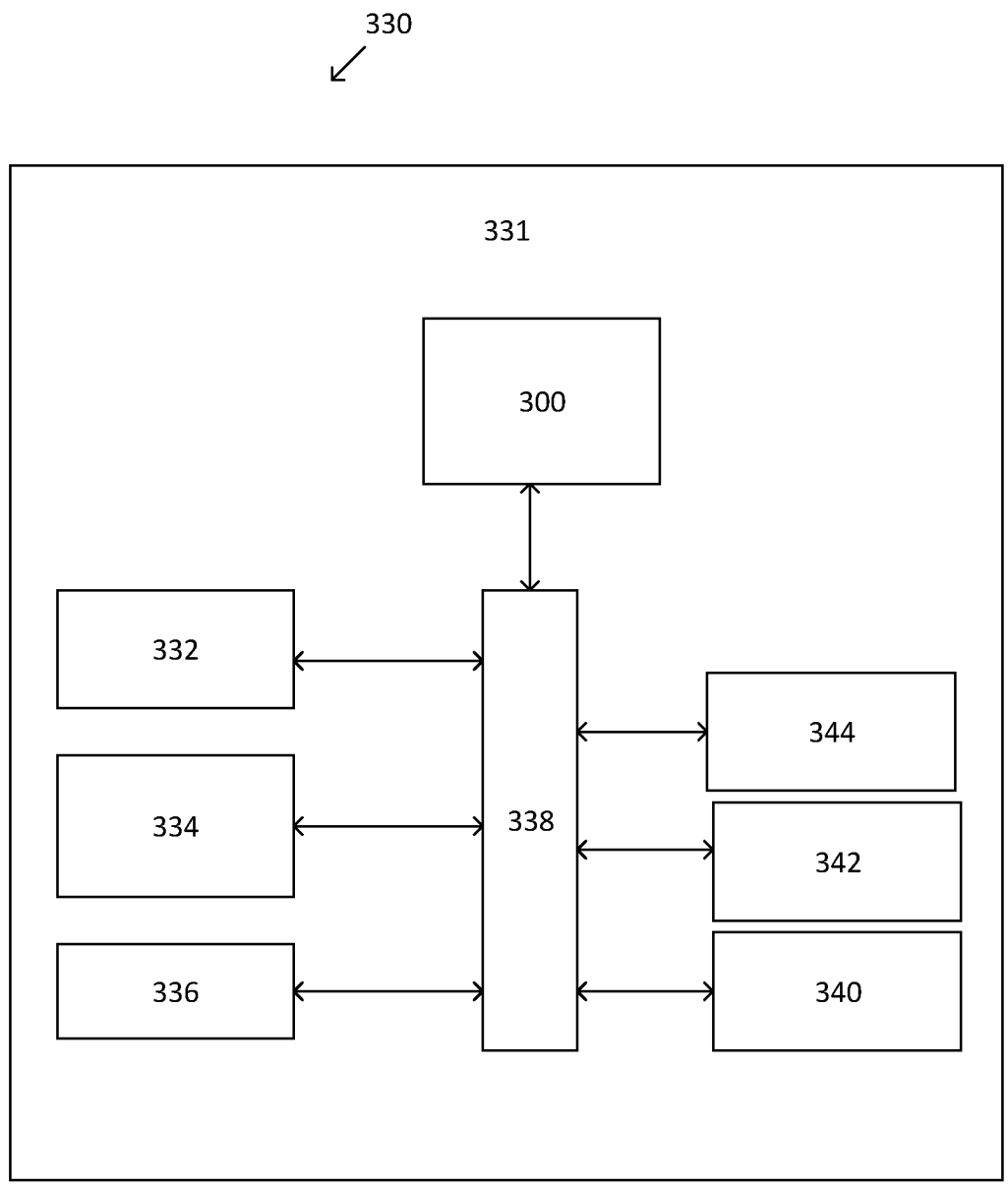
FIG. 3 represents a schematic of a computing system according to embodiments.

Turning now to FIG. 3, illustrated is a schematic of an embodiment of a portion of a computing system 330, including one or more of the modules/package structures 300 of the embodiments included herein. The module 300 may include any or all of the elements of the embodiments included herein as a part of the system 330.

In some embodiments, the system 330 includes a processing means such as one or more processors 332 coupled to one or more buses or interconnects, shown in general as bus 338. The processors 332 may comprise one or more physical processors and one or more logical processors. In some embodiments, the processors may include one or more general-purpose processors or special-processor processors.

The bus 338 may be a communication means for transmission of data. The bus 338 may be a single bus for shown for simplicity, but may represent multiple different interconnects or buses and the component connections to such interconnects or buses may vary. The bus 338 shown in FIG. 3 is an abstraction that represents any one or more separate physical buses, point-to-point connections, or both connected by appropriate bridges, adapters, or controllers. In some embodiments, the system 330 further comprises a random access memory (RAM) or other dynamic storage device or element as a main memory 334 for storing information and instructions to be executed by the processors 332. Main memory 334 may include, but is not limited to, dynamic random access memory (DRAM). The system 330 also may comprise one or more passive devices 336, such as capacitors and inductors, that may be installed on a board, such as a printed circuit board 331.

In some embodiments, the system 330 includes one or more transmitters or receivers 340 coupled to the bus 338. In some embodiments, the system 330 may include one or more antennae 344 (internal or external), such as dipole or monopole antennae, for the transmission and reception of data via wireless communication using a wireless transmitter, receiver, or both, and one or more ports 342 for the transmission and reception of data via wired communications. Wireless communication includes, but is not limited to, Wi-Fi, Bluetooth™, near field communication, and other wireless communication standards. In an embodiment at least one antenna may be included in the module 300, as described herein.

System 330 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Figure 4:
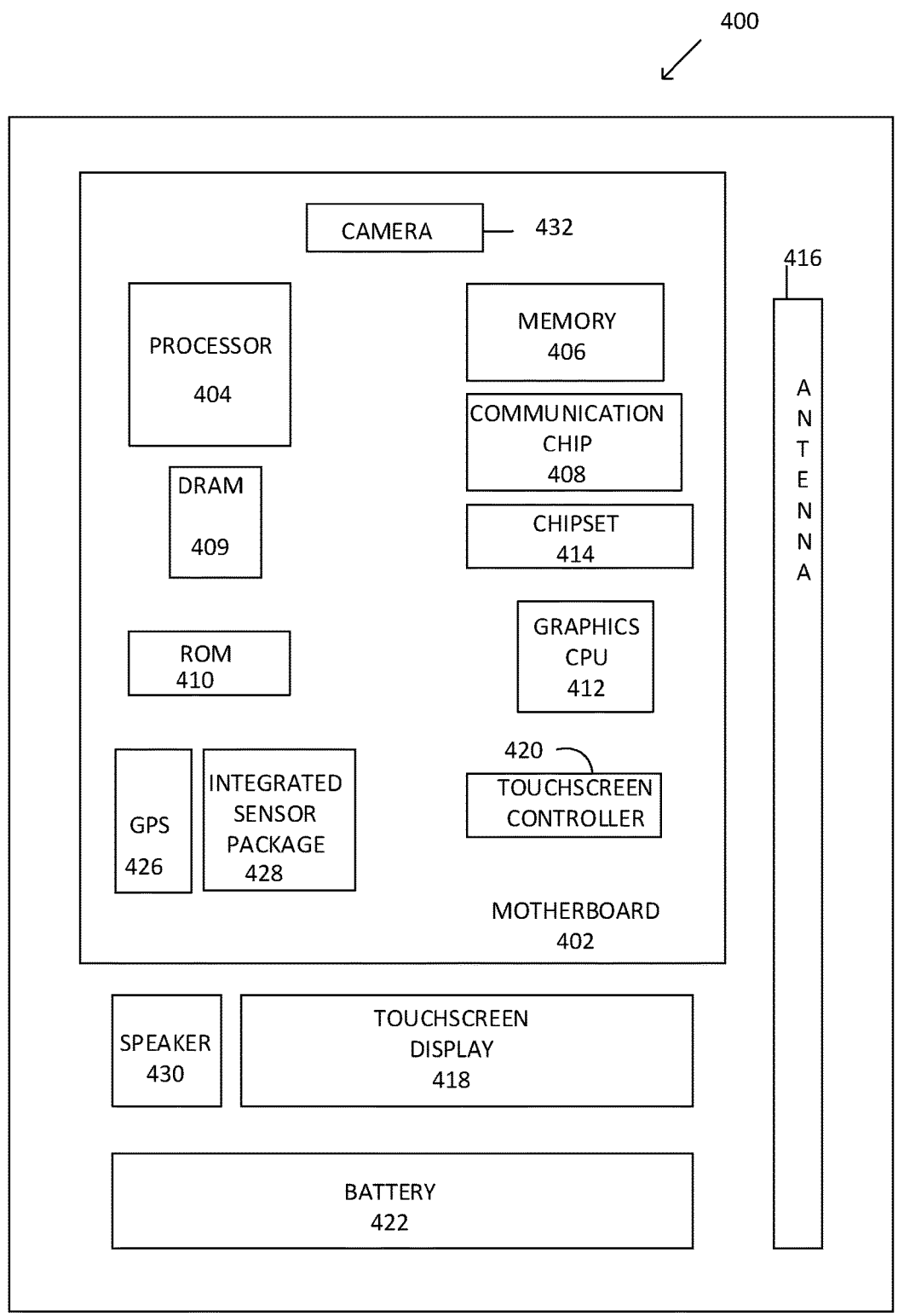
FIG. 4 represents a schematic of a computing device according to embodiments.

FIG. 4 is a schematic of a computing device 400 that may be implemented incorporating embodiments of the package structures described herein. For example, any suitable ones of the components of the computing device 400 may include, or be included in, a package structure, such as package structure/module 100 of FIG. 1a, for example, or in accordance with any of the embodiments disclosed herein. In an embodiment, the computing device 400 houses a board 402, such as a motherboard 402 for example. The board 402 may include a number of components, including but not limited to a processor 404, an on-die memory 406, and at least one communication chip 408. The processor 404 may be physically and electrically coupled to the board 402. In some implementations the at least one communication chip 408 may be physically and electrically coupled to the board 402. In further implementations, the communication chip 408 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 409, non-volatile memory (e.g., ROM) 410, flash memory (not shown), a graphics processor unit (GPU) 412, a chipset 414, an antenna 416, a display 418 such as a touchscreen display, a touchscreen controller 420, a battery 422, an audio codec (not shown), a video codec (not shown), a global positioning system (GPS) device 426, a speaker 430, a camera 432, compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the package structures described herein may incorporate/may be incorporated within one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising a die on a first substrate, at least one component adjacent the die on the first substrate, a molding material on the die and the at least one component, wherein the die and the at least one component are completely embedded in the molding material; a second substrate, wherein the first substrate is disposed on a top surface of the second substrate; and at least one communication structure disposed on a surface of the second substrate.

Example 2 includes the microelectronic package structure of example 1 wherein a top surface of the second substrate does not comprise the molding material.

Example 3 includes the microelectronic package structure of example 1 wherein the second substrate comprises low density routing printed circuit board (PCB).

Example 4 includes the microelectronic package structure of example 1 wherein a shielding material is disposed on a top surface and at least one side surface of the molding material.

Example 5 Includes the microelectronic package structure of example 1 wherein an individual one of the at least one communication structure is disposed on a top surface of the second substrate.

Example 6 includes the microelectronic package structure of example 1 wherein a first communication structure is disposed on a bottom surface of the second substrate.

Example 7 includes the microelectronic package structure of example 7 wherein a second communication structure is disposed on a top surface of the second substrate.

Example 8 includes the microelectronic package structure of example 1 wherein the at least one component and the at least one die are fully embedded in the molding material.

Example 9 is a microelectronic package structure comprising a die on a first substrate; at least one component adjacent the die on the first substrate; a molding material on the first substrate, wherein the at least one component and the die are embedded in the molding material; and a first portion of a first communication structure disposed on a portion of a top surface of the molding material, and a second portion of the first communication structure disposed through a portion of the molding material and disposed on a top surface of the first substrate.

Example 10 includes the microelectronic package structure of example 9 wherein the first communication structure comprises an antenna structure, and wherein a shielding material is adjacent the antenna structure and is disposed directly on a top surface of the molding material.

Example 11 includes the microelectronic package structure of example 9 wherein a second substrate is disposed on a bottom surface of the first substrate.

Example 12 includes the microelectronic package structure of example 11 wherein the second substrate comprises an edge shielding structure.

Example 13 includes the microelectronic package structure of example 11 wherein a second communication structure is disposed on a top surface of the second substrate.

Example 14 includes the microelectronic package structure of example 9 wherein a top surface and a side surface of the molding material comprises an RF shielding material disposed thereon.

Example 15 includes the microelectronic package structure of example 11 wherein a top surface of the second substrate comprises a second communication structure disposed thereon, and a bottom surface of the second substrate comprises a third communication structure disposed thereon.

Example 16 Includes the microelectronic package structure of example 9, wherein a bottom surface of the first substrate comprises a second communication structure disposed thereon.

Example 17 is a system comprising: a processor for processing data; a memory for storage of data; a transmitter or receiver for transmission and reception of data; and a module including: a die on a first substrate; at least one component adjacent the die on the first substrate; a molding material on the die and the at least one component, wherein the die and the at least one component are completely embedded in the molding component; and a second substrate, wherein the first substrate is disposed on a top surface of the second substrate, and wherein at least one antenna is disposed on at least one surface of the second substrate.

Example 18 includes the system of example 17 wherein a top surface of the second substrate does not comprise the molding material thereon.

Example 19 includes the method of example 17 wherein the second substrate comprises a low density substrate.

Example 20 includes the system of example 17 further comprising wherein RF shielding is disposed on a top surface of the molding material adjacent a communication structure disposed on the molding material.

Example 21 includes the system of example 17 further comprising wherein the first substrate comprises an embedded trace substrate.

Example 22 includes the system of example 17 further comprising wherein a first antenna is disposed on a top surface of the second substrate, and wherein a second antenna is disposed on a bottom surface of the second substrate.

Example 23 includes the system of example 17 wherein a first portion of a first communication structure is disposed on a portion of a top surface of the molding material, and a second portion of the first communication structure is disposed through a portion of the molding material, wherein the second portion is disposed on a top surface of the first substrate.

Example 24 includes the system of example 17 wherein a first antenna is disposed on a top surface of the second substrate adjacent a footprint of the first substrate, and a second antenna is disposed on a bottom surface of the second substrate.

Example 25 includes the system of example 17 wherein the die comprises a wireless die or a system on a chip.

Example 26 is a method of forming a microelectronic package structure, comprising: providing a first substrate, wherein the first substrate comprises at least one die and at least one component embedded within a molding compound; and attaching the first substrate to a second substrate, wherein the second substrate comprises at least one antenna on at least one surface of the second substrate, and wherein the second substrate comprises a lower routing density than a routing density of the first substrate.

Example 27 includes the method of forming the microelectronic package structure of example 26 wherein the second substrate does not comprise the molding material on a top surface of the second substrate.

Example 28 includes the method of forming the microelectronic package structure of example 26 wherein at least one of the at least one component is disposed within a cavity.

Example 29 includes the method of forming the microelectronic package structure of example 26 further comprising wherein the first substrate comprises a multiple component structure disposed on a top surface of the first substrate.

Example 30 includes the method of forming the microelectronic package structure of example 26 further comprising wherein the second substrate may comprise an antenna and/or connector disposed on a top surface.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic package structure comprising:
   a die on a first substrate;
   at least one component adjacent the die on the first substrate;
   a molding material on the die and the at least one component, wherein the die and the at least one component are completely embedded in the molding material;
   a second substrate, wherein the first substrate is on a top surface of the second substrate, and wherein the second substrate comprises low density routing printed circuit board (PCB); and
   at least one communication structure on a surface of the second substrate.

2. The microelectronic package structure of claim 1 wherein a top surface of the second substrate does not comprise the molding material.

3. The microelectronic package structure of claim 1 wherein a shielding material is on a top surface and on a side surface of the molding material.

4. The microelectronic package structure of claim 1 wherein an individual one of the at least one communication structure is on a top surface of the second substrate.

5. The microelectronic package structure of claim 1 wherein a first communication structure is on a bottom surface of the second substrate.

6. The microelectronic package structure of claim 5 wherein a second communication structure is on a top surface of the second substrate.

7. The microelectronic package structure of claim 1 wherein the at least one component and the at least one die are fully embedded in the molding material.

8. A microelectronic package structure comprising:
   a die on a first substrate;
   at least one component adjacent the die on the first substrate;
   a molding material on the first substrate, wherein the at least one component and the die are embedded in the molding material; and
   a first portion of a first communication structure on a portion of a top surface of the molding material, and a second portion of the first communication structure through a portion of the molding material and on a top surface of the first substrate.

9. The microelectronic package structure of claim 8 wherein the first communication structure comprises an antenna structure, and wherein a shielding material is adjacent the antenna structure and is directly on a top surface of the molding material.

10. The microelectronic package structure of claim 8 wherein a second substrate is on a bottom surface of the first substrate.

11. The microelectronic package structure of claim 10 wherein a second communication structure is on a top surface of the second substrate.

12. The microelectronic package structure of claim 10 wherein a second communication structure is on a bottom surface of the second substrate.

13. The microelectronic package structure of claim 10 wherein a top surface of the second substrate comprises a second communication structure thereon, and a bottom surface of the second substrate comprises a third communication structure thereon.

14. The microelectronic package structure of claim 8 wherein a top surface and a side surface of the molding material comprises an RF shielding material thereon.

15. The microelectronic package structure of claim 8, wherein a bottom surface of the first substrate comprises a second communication structure thereon.

16. A system comprising:
   a processor to process data;
   a memory for storage of data;
   a transmitter or a receiver for transmission and reception of data;
   and
   a module including:
      a die on a first substrate;
      at least one component adjacent the die on the first substrate;
      a molding material on the die and the at least one component, wherein the die and the at least one component are completely embedded in the molding component;
      a second substrate, wherein the first substrate is on a top surface of the second substrate; and
      a first antenna on a top surface of the second substrate, and a second antenna on a bottom surface of the second substrate.

17. The system of claim 16 wherein a top surface of the second substrate does not comprise the molding material thereon.

18. The method of claim 16 wherein the second substrate comprises a low density substrate.

19. The system of claim 16 further comprising wherein an RF shielding material is on a top surface of the molding material adjacent a communication structure on the molding material.

20. The system of claim 16 further comprising wherein the first substrate comprises an embedded trace substrate.

21. The system of claim 16 wherein a first portion of a first communication structure is on a portion of a top surface of the molding material, and a second portion of the first communication structure is through a portion of the molding material and is on a top surface of the first substrate.

22. The system of claim 21 wherein the first antenna is not below a footprint of the first substrate.

23. The system of claim 16 wherein the die comprises a wireless die or a system on a chip.

* * * * *